(12) United States Patent
Nathan et al.

(10) Patent No.: US 7,414,600 B2
(45) Date of Patent: Aug. 19, 2008

(54) PIXEL CURRENT DRIVER FOR ORGANIC LIGHT EMITTING DIODE DISPLAYS

(75) Inventors: Arokia Nathan, Waterloo (CA); Peyman Servati, Waterloo (CA); Kapil Sakariya, Waterloo (CA); Anil Kumar, Kitchener (CA)

(73) Assignee: Ignis Innovation Inc., Waterloo, Ontario (CA)

( * ) Notice: Subject to any disclaimer, the term of this patent is extended or adjusted under 35 U.S.C. 154(b) by 311 days.

(21) Appl. No.: 11/247,455

(22) Filed: Oct. 11, 2005

(65) Prior Publication Data

US 2006/0027807 A1 Feb. 9, 2006

Related U.S. Application Data

(63) Continuation of application No. 10/468,319, filed as application No. PCT/CA02/00173 on Feb. 18, 2002, now abandoned.

(60) Provisional application No. 60/268,900, filed on Feb. 16, 2001.

(51) Int. Cl.
*G09G 3/32* (2006.01)
(52) U.S. Cl. .............. 345/82; 345/92; 345/76; 315/169.3
(58) Field of Classification Search .............. 345/82, 345/92, 76; 330/308; 315/169.3
See application file for complete search history.

(56) References Cited

U.S. PATENT DOCUMENTS

| | | | |
|---|---|---|---|
| 4,996,523 A | 2/1991 | Bell et al. | |
| 5,266,515 A | 11/1993 | Robb et al. | |
| 5,498,880 A | 3/1996 | Lee et al. | |
| 5,619,033 A | 4/1997 | Weisfield | |
| 5,648,276 A | 7/1997 | Hara et al. | |
| 5,714,968 A | 2/1998 | Ikeda | |
| 5,874,803 A | 2/1999 | Garbuzov et al. | |

(Continued)

FOREIGN PATENT DOCUMENTS

CA 2242720 1/2000

(Continued)

OTHER PUBLICATIONS

Patent Abstracts of Japan vol. 1997, No. 08, Aug. 29, 1997 -& JP 09 090405 A (Sharp Corp), Apr. 4, 1997 abstract.

(Continued)

*Primary Examiner*—Patricia Nguyen
(74) *Attorney, Agent, or Firm*—Pearne & Gordon LLP (57) ABSTRACT

A pixel current driver comprises a plurality of thin film transistors (TFTs) each having dual gates and for driving OLED layers. A top gate of the dual gates is formed between a source and a drain of each of the thin film transistors, to thereby minimize parasitic capacitance. The top gate is grounded or electrically tied to a bottom gate. The plurality of thin film transistors may be two thin film transistors formed in voltage-programmed manner or five thin film transistors formed in a current-programmed $\Delta V_T$-compensated manner. Other versions of the current-programmed circuit with different numbers of thin film transistors are also presented that compensate for $\delta V_T$. The OLED layer are continuous and vertically stacked on the plurality of thin film transistors to provide an aperture ratio close to 100%.

7 Claims, 13 Drawing Sheets

U.S. PATENT DOCUMENTS

| | | | |
|---|---|---|---|
| 5,903,248 A | 5/1999 | Irwin | |
| 5,917,280 A | 6/1999 | Burrows et al. | |
| 6,023,259 A | 2/2000 | Howard et al. | |
| 6,091,203 A | 7/2000 | Kawashima et al. | |
| 6,229,508 B1 | 5/2001 | Kane | |
| 6,246,180 B1 | 6/2001 | Nishigaki | |
| 6,252,248 B1 | 6/2001 | Sano et al. | |
| 6,307,322 B1 | 10/2001 | Dawson et al. | |
| 6,580,408 B1 | 6/2003 | Bae et al. | |
| 6,693,610 B2 * | 2/2004 | Shannon et al. | 345/76 |
| 7,129,914 B2 * | 10/2006 | Knapp et al. | 345/76 |
| 7,248,236 B2 * | 7/2007 | Nathan et al. | 345/76 |
| 2001/0002703 A1 | 6/2001 | Koyama | |
| 2001/0026257 A1 | 10/2001 | Kimura | |
| 2001/0030323 A1 | 10/2001 | Ikeda | |
| 2001/0043173 A1 | 11/2001 | Troutman | |
| 2001/0045929 A1 | 11/2001 | Prache et al. | |
| 2002/0000576 A1 | 1/2002 | Inukai | |
| 2002/0011796 A1 | 1/2002 | Koyama | |
| 2002/0011799 A1 | 1/2002 | Kimura | |
| 2005/0067971 A1 * | 3/2005 | Kane | 315/169.3 |
| 2006/0261841 A1 * | 11/2006 | Fish | 324/770 |

FOREIGN PATENT DOCUMENTS

| | | |
|---|---|---|
| EP | 1 028 471 | 8/2000 |
| EP | 1 130 565 A1 | 9/2001 |

OTHER PUBLICATIONS

Ma E Y et al: "Organic Light-Emitting Diode/Thin Film Transistor Integration for Foldable Displays" Conference Record of the 1997 International Display Research Conference and International Workshops on LCD Technology and Emissive Technology. Toronto, Sep. 15-19, 1997, International Display Research Conference (IDRC), Santa Ana, CA, SID, US, vol. CONF. 17, Sep. 15, 1997, pp. 78-81, XP000931235 p. L-78, col. 2, last paragraph-p. L-80, col. 1, paragraph 1.

Patent Abstracts of Japan vol. 1999, No. 13, Nov. 30, 1999 -& JP 11 231805 A (Sanyo Electric Co Ltd), Aug. 27, 1999 abstract.

Stewart M. et al., "Polysilicon TFT Technology for Active Matrix OLED Displays" IEEE Transactions on Electron Devices, vol. 48, No. 5, pp. 845-851, May 5, 2001.

Nathan A et al: "Thin film technology on glass and plastic" ICM 2000. Proceedings of the 12th International Conference on Microelectronics. (IEEE Cat. No. 00EX453), ICM 2000. Proceedings of the 12th International Conference on Microelectronics, Tehran, Iran, Oct. 31-Nov. 2, 2000, pp. 11-14, XP002206242 2000, Tehran, Iran, Univ. Tehran, Iran, ISBN: 964-360-057-2, p. 13, col. 1, line 11-48.

* cited by examiner

⊠ glass substrate ☐ a-SiN$_x$:H  ☐ a-Si:H  ▨ n$^+$μc-Si:H  ■ metal

PIXEL CURRENT DRIVER FOR ORGANIC LIGHT EMITTING DIODE DISPLAYS

This application is a continuation application of U.S. patent application Ser. No. 10/468,319 filed Jan. 23, 2004 now abandoned, which is the U.S. National Phase of PCT/CA02/00173 having an International Filing Date of Feb. 18, 2002, which claims the benefit of U.S. Provisional Patent Application Ser. No. 60/268,900 filed on Feb. 16, 2001.

BACKGROUND OF THE INVENTION

1. Field of the Invention

The present invention relates to a an organic light emitting diode display, and more particularly to an a pixel current driver for an organic light emitting display (OLED), capable of minimizing parasitic couplings between the OLED and the transistor layers.

2. Description of the Prior Art

OLED displays have gained significant interest recently in display applications in view of their faster response times, larger viewing angles, higher contrast, lighter weight, lower power, amenability to flexible substrates, as compared to liquid crystal displays (LCDs). Despite the OLED's demonstrated superiority over the LCD, there still remain several challenging issues related to encapsulation and lifetime, yield, color efficiency, and drive electronics, all of which are receiving considerable attention. Although passive matrix addressed OLED displays are already in the marketplace, they do not support the resolution needed in the next generation displays, since high information content (HIC) formats are only possible with the active matrix addressing scheme. Active matrix addressing involves a layer of backplane electronics, based on thin-film transistors (TFTs) fabricated using amorphous silicon (a-Si:H), polycrystalline silicon (poly-Si), or polymer technologies, to provide the bias voltage and drive current needed in each OLED pixel. Here, the voltage on each pixel is lower and the current throughout the entire frame period is a low constant value, thus avoiding the excessive peak driving and leakage currents associated with passive matrix addressing. This in turn increases the lifetime of the OLED.

Figure 2:
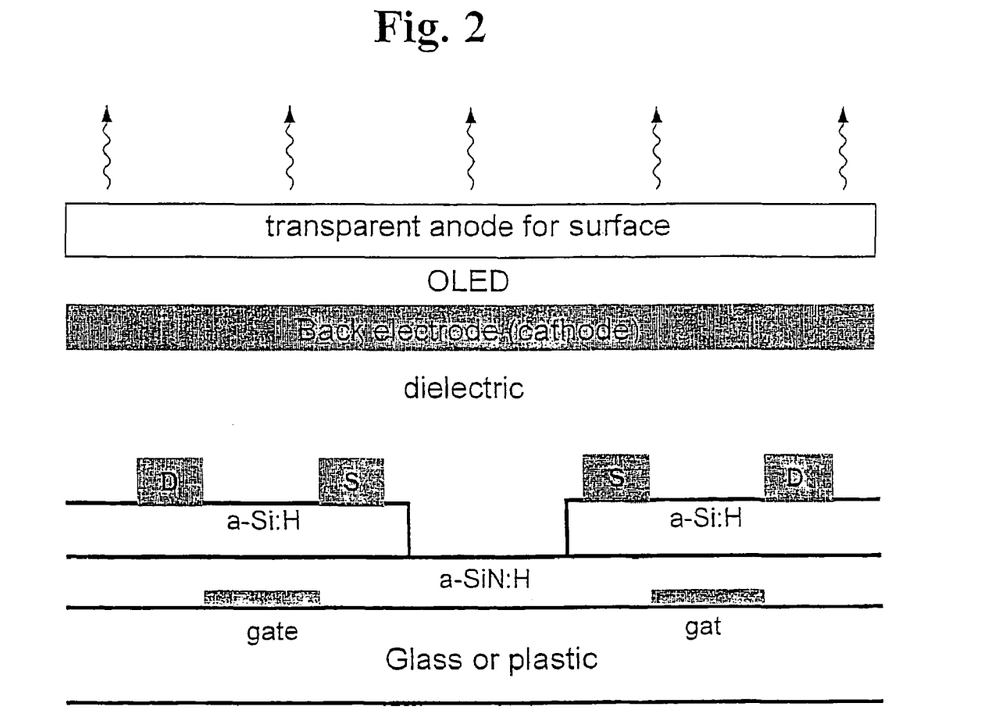
FIG. 2 shows a pixel architecture for surface emissive a-Si:H AMOLED displays.

In active matrix OLED (AMOLED) displays, it is important to ensure that the aperture ratio or fill factor (defined as the ratio of light emitting display area to the total pixel area) should be high enough to ensure display quality. Conventional AMOLED displays are based on light emission through an aperture on the glass substrate where the backplane electronics is integrated. Increasing the on-pixel density of TFT integration for stable drive current reduces the size of the aperture. The same happens when pixel sizes are scaled down. The solution to having an aperture ratio that is invariant on scaling or on-pixel integration density is to vertically stack the OLED layer on the backplane electronics, along with a transparent top electrode (see FIG. 2). In FIG. 2, reference numerals S and D denote a source and a drain respectively. This implies a continuous back electrode over the OLED pixel. However, this continuous back electrode can give rise to parasitic capacitance, whose effects become significant when the electrode runs over the switching and other thin film transistors (TFTs). Here, the presence of the back electrode can induce a parasitic channel in TFTs giving rise to high leakage current. The leakage current is the current that flows between source and drain of the TFT when the gate of the TFT is in its OFF state.

SUMMARY OF THE INVENTION

Accordingly, it is an object of the present invention to provide to a pixel current driver for an organic light emitting display(OLED), capable of minimizing parasitic couplings between the OLED and the transistor layers.

In order to achieve the above object, a pixel current driver for OLED layer for emitting light according to the present invention comprises a plurality of thin film transistors (TFTs) each having dual gates and for driving the OLED layer. A top gate of the dual gates is formed between a source and a drain of each of the thin film transistors, to thereby minimize parasitic capacitance.

Each of the thin film transistor may be an a-Si:H based thin film transistor or a polysilicon-based thin film transistor.

The pixel current driver is a current mirror based pixel current driver for automatically compensating for shifts in the Vth of each of the thin film transistor in a pixel and the pixel current driver is for monochrome displays or for full color displays.

The dual gates are fabricated in a normal inverted staggered TFT structure. A width of each of the TFTs is formed larger than a length of the same to provide enough spacing between the source and drain for the top gate. Preferably, the length is 30 μm and the width is 1600 μm. The length and width of the transistors may change depending on the maximum drive current required by the circuit and the fabrication technology used. The top gate is grounded or electrically tied to a bottom gate. The plurality of thin film transistors may be two thin film transistors formed in voltage-programmed manner or five thin film transistors formed in a current-programmed $\Delta V_T$-compensated manner, or four or The OLED layer is vertically stacked on the plurality of thin film transistors.

With the above structure of an a-Si:H current driver according to the present invention, the charge induced in the top channel of the TFT is minimized, and the leakage currents in the TFT is minimized so as to enhance circuit performance.

BRIEF DESCRIPTION OF THE DRAWINGS

The above objects and features of the present invention will become more apparent by describing in detail preferred embodiments thereof with reference to the attached drawings in which.

DETAILED DESCRIPTION OF THE PREFERRED EMBODIMENTS

Figure 1:
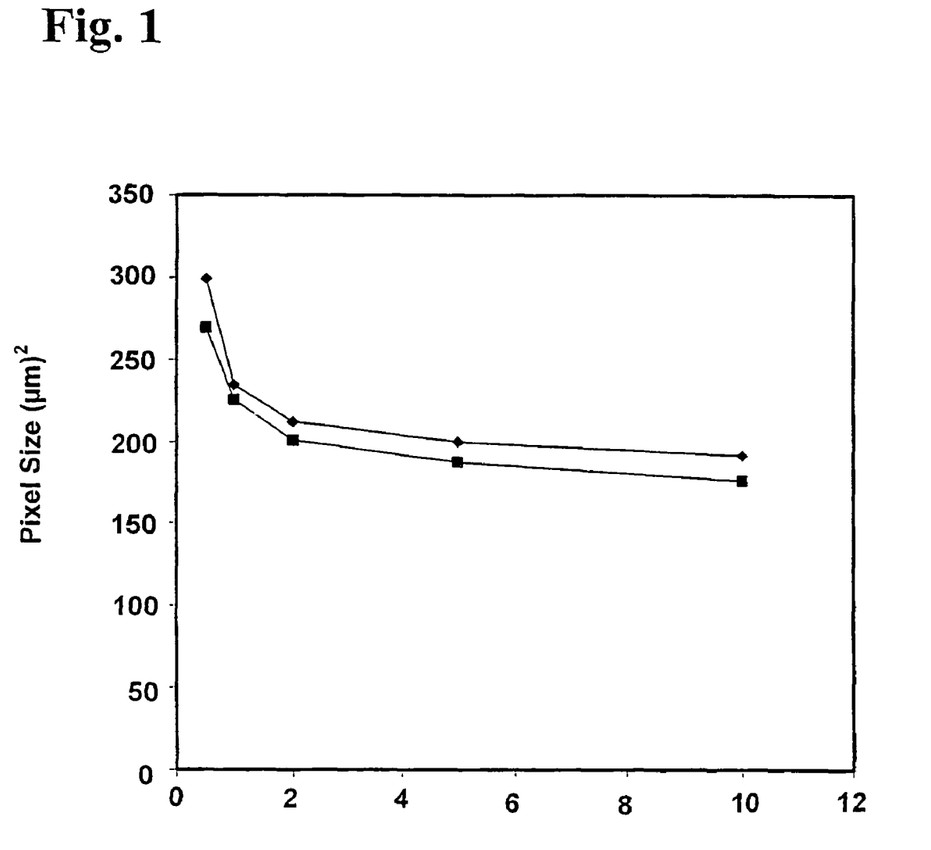
FIG. 1 shows variation of required pixel areas with mobility for 2-T and 5-T pixel drivers.

Although amorphous Si does not enjoy equivalent electronic properties compared to poly-Si, it adequately meets many of the drive requirements for small area displays such as those needed in pagers, cell phones, and other mobile devices. Poly-Si TFTs have one key advantage in that they are able to provide better pixel drive capability because of their higher mobility, which can be of the order of $\mu_{FE} \sim 100$ cm$^2$/Vs. This makes poly-Si highly desirable for large area (e.g. laptop size) VGA and SVGA displays. The lower mobility associated with a-Si:H TFTs ($\mu_{FE} \sim 1$ cm$^2$/Vs) is not a limiting factor since the drive transistor in the pixel can be scaled up in area to provide the needed drive current. The OLED drive current density is typically 10 mA/cm$^2$ at 10V operation to provide a brightness of 100 cd/m$^2$—the required luminance for most displays. For example, with an a-Si:H TFT mobility of 0.5 cm$^2$/Vs and channel length of 25 μm, this drive current requirement translates into required pixel area of 300 μm$^2$, which adequately meets the requirements of pixel resolution and speed for some 3 inch monochrome display applications. FIG. 1 illustrates simulation results for the variation of the required pixel size with device mobility calculated for two types of drivers, which will be elaborated later, the 2-T and the 5-T drivers, wherein $\mu_0$ denotes a reference mobility whose value is in the range 0.1 to 1 cm$^2$/Vs. For instance, the area of the pixel for the 2-T driver (see FIG. 5A) comprises of the area of the switching transistors, area of the drive transistor, and the area occupied by interconnects, bias lines, etc. In FIG. 1, the drive current and frame rate are kept constant at 10 μA and 50 Hz, respectively, for a 230×230 array. It is clear that there is no significant savings in area between the 2-T and 5-T drivers but the savings are considerable with increasing mobility. This stems mainly from the reduction in the area of the drive transistor where there is a trade-off between $\mu_{FE}$ and TFT aspect ratio, W/L (Wide/Length).

In terms of threshold voltage ($V_T$) uniformity and stability, both poly-Si and a-Si:H share the same concerns, although in comparison, the latter provides for better spatial uniformity but not stability ($\Delta V_T$). Thus the inter-pixel variation in the drive current can be a concern in both cases, although clever circuit design techniques can be employed to compensate for $\Delta V_T$ hence improving drive current uniformity. In terms of long term reliability, it is not quite clear with poly-Si technology, although there are already products based on a-Si:H technology for displays and imaging, although the reliability issues associated with OLEDs may yet be different. The fabrication processes associated with a-Si:H technology are standard and adapted from mainstream integrated circuit (IC) technology, but with capital equipment costs that are much lower. One of the main advantages of the a-Si:H technology is that it has become low cost and well-established technology, while poly-Si has yet to reach the stage of manufacturability.

The technology also holds great promise for futuristic applications since good as deposited a-Si:H, a-SiN$_x$:H, and TFT arrays can be achieved at low temperatures ($\leqq$120° C.) thus making it amenable to plastic substrates, which is a critical requirement for mechanically flexible displays.

To minimize the conduction induced in all TFTs in the pixel by the back electrode, an alternate TFT structure based on a dual-gate structure is employed. In a dual gate TFT (see FIG. 3), a top gate electrode is added to the TFT structure to prevent the OLED electrodes from biasing the a-Si:H channel area (refer to FIG. 2). The voltage on the top gate can be chosen such so as to minimize the charge induced in the (parasitic) top channel of the TFT. The objective underlying the choice of the voltage on the top gate is to minimize parasitic capacitance in the driver circuits and leakage currents in the TFTs so as to enhance circuit performance. In what follows, the operation of the dual-gate TFT is described, which will be central to surface emissive (100% aperture ratio) AMOLED displays based on a-Si:H backplane electronics.

Figure 3:
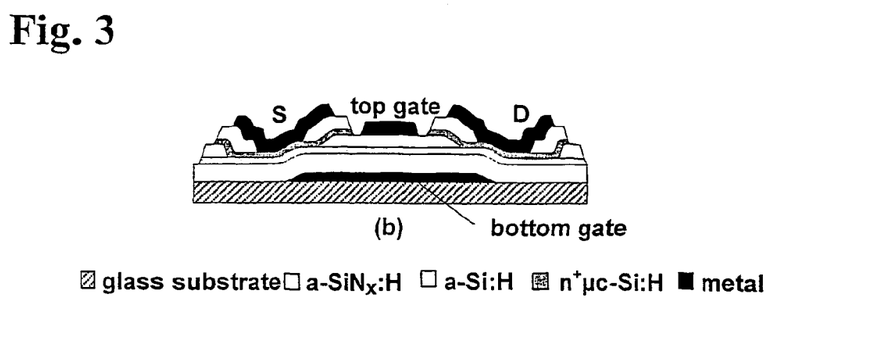
FIG. 3 shows a cross section of a dual-gate TFT structure.

FIG. 3 illustrates the structure of a dual-gate TFT fabricated for this purpose, wherein reference numerals S and D denote a source and a drain respectively. The fabrication steps are the same as of that of a normal inverted staggered TFT structure except that it requires a sixth mask for patterning the top gate. The length of the TFT is around 30 μm to provide enough spacing between the source and drain for the top gate, and the width is made very large (1600 μm) with four of these TFTs are interconnected in parallel to create a sizeable leakage current for measurement. A delay time is inserted in the measurement of the current to ensure that the measurement has passed the transient period created by defects in the a-Si:H active layer, which give rise to a time-dependent capacitance.

Figure 4:
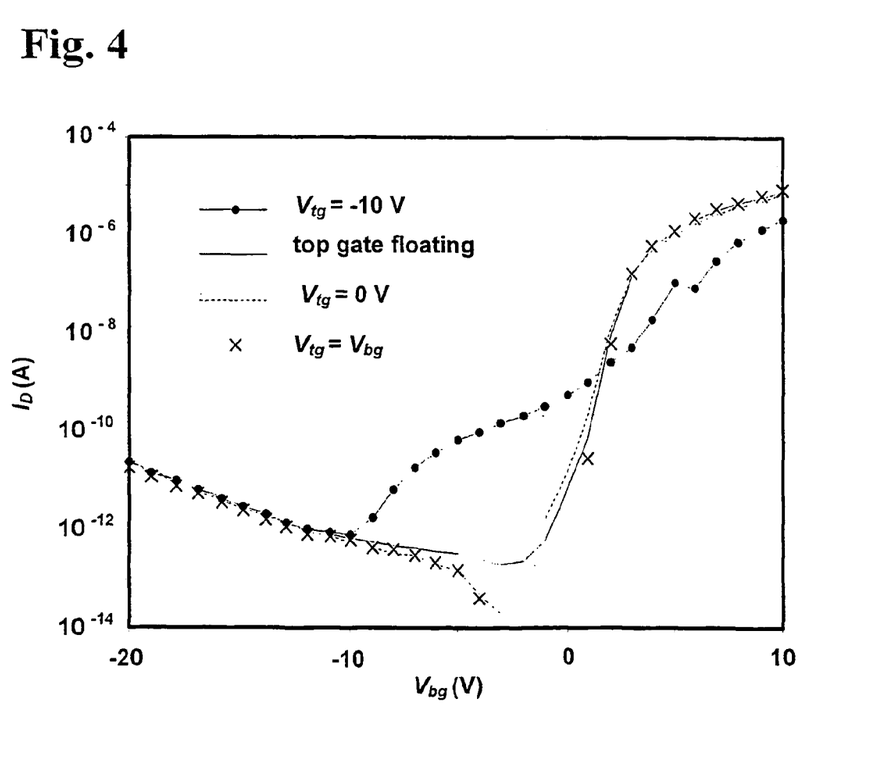
FIG. 4 shows forward and reverse transfer characteristics of dual-gate TFT for various top gate biases.

FIG. 4 shows results of static current measurements for four cases: first when the top gate is tied to −10V, second when the top gate is grounded, third when the top gate is floating, and lastly when the top gate is shorted to the bottom gate. With a floating top gate, the characteristics are almost similar to that of a normal single gate TFT. The leakage current is relatively high particularly when the top gate is biased with a negative voltage. The lowest values of leakage current are obtained when the top gate is pegged to either 0V or to the voltage of the bottom gate. In particular, with the latter the performance of the TFT in the (forward) sub-threshold regime of operation is significantly improved. This enhancement in sub-threshold performance can be explained by the forced shift of the effective conduction path away from the bottom interface to the bulk a-Si:H region due to the positive bias on the top gate. This in turn decreases the effect of the trap states at the bottom interface on the sub-threshold slope of the TFT.

It should be noted that although the addition of another metal contact as the top gate reduces the leakage current of the TFT, it can potentially degrade pixel circuit performance by possible parasitic capacitances introduced by vertically stacking the OLED pixel. Thus the choice of top gate connection becomes extremely critical. For example, if the top gates in the pixel circuit are connected to the bottom gates of the associated TFTs, this gives rise to parasitic capacitances located between the gates and the cathode, which can lead to undesirable display operation (due to the charging up of the parasitic capacitance) when the multiplexer O/P drives the TFT switch. On the other hand, if the top gates are grounded, this results in the parasitic capacitance being grounded to yield reliable and stable circuit operation.

Figure 5A:
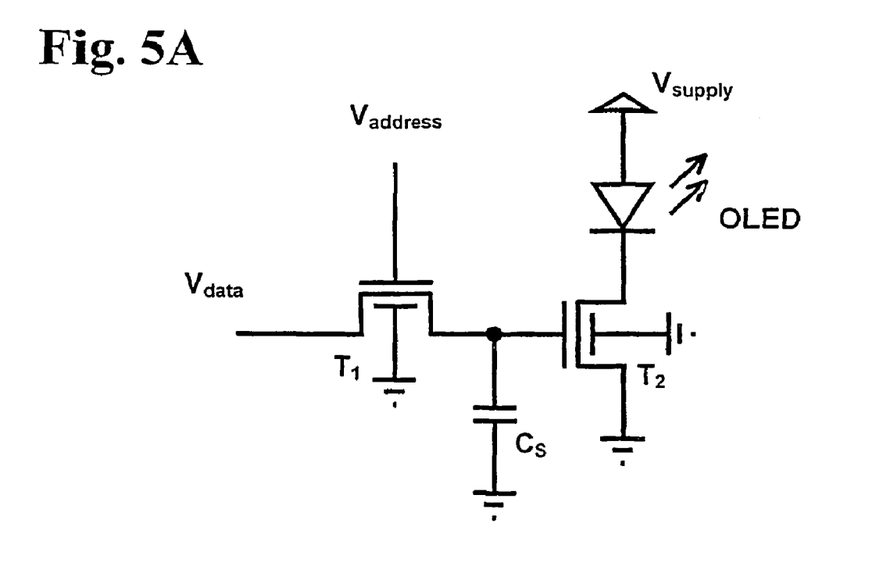
FIG. 5A and FIG. 5B show an equivalent circuit for a 2-T pixel driver and its associated input-output timing diagrams.
Figure 5B:
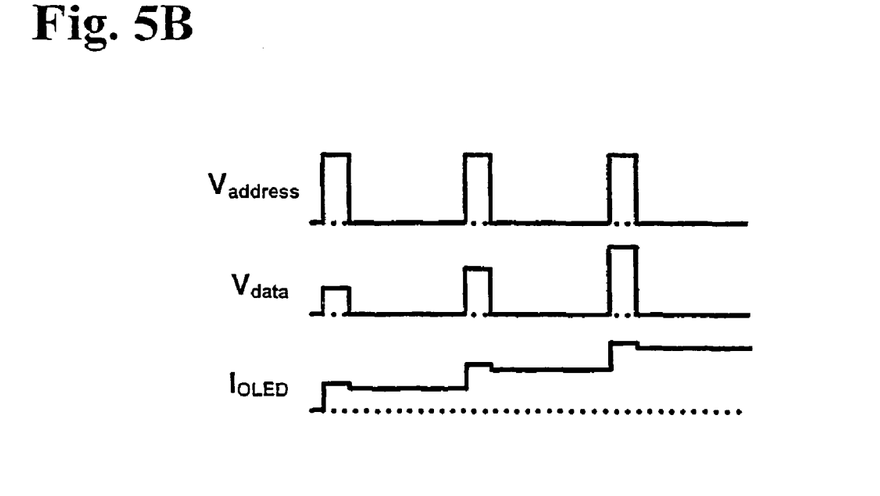
Figure 6A:
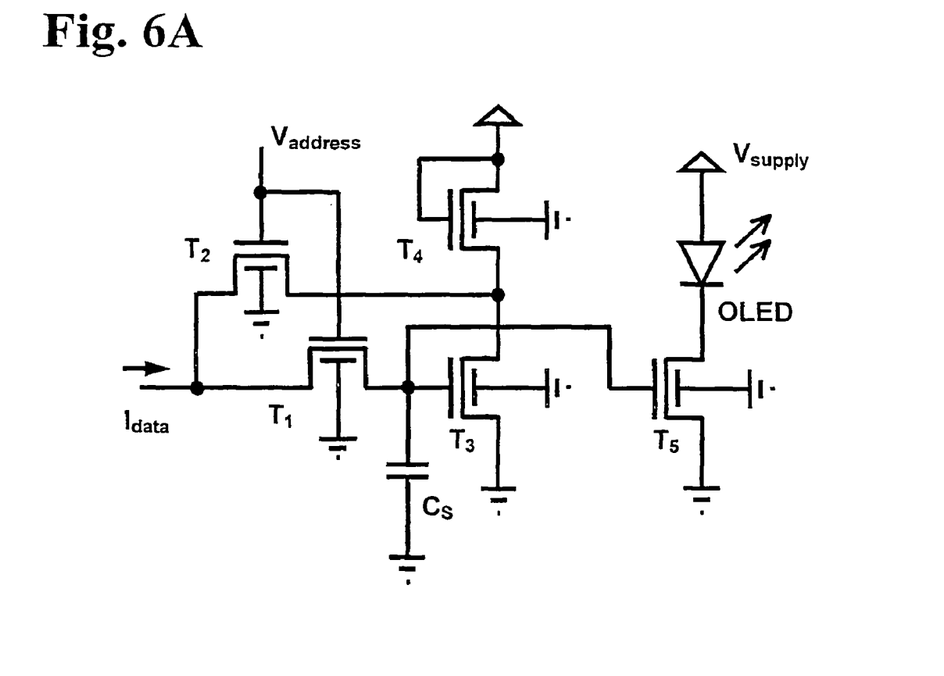
FIG. 6A and FIG. 6B show an equivalent circuit for a 5-T pixel driver and its associated input-output timing diagrams.

The OLED drive circuits considered here are the well-known voltage-programmed 2-T driver and the more sophisticated current-programmed $\Delta V_T$-compensated 5-T version (see FIGS. 5A and 6A). The latter is a significant variation of the previous designs, leading to reduced pixel area (<300 µm), reduced leakage, lower supply voltage (20V), higher linearity (~30 db), and larger dynamic range (~40 dB). Before dwelling on the operation of the 5-T driver, the operation of the relatively simple voltage-driven 2-T driver is described. FIG. 5B shows input-output timing diagrams of the 2-T pixel driver. When the address line is activated, the voltage on the data line starts charging capacitor $C_S$ and the gate capacitance of the driver transistor $T_2$. Depending on the voltage on the data line, the capacitor charges up to turn the driver transistor $T_2$ on, which then starts conducting to drive the OLED with the appropriate level of current. When the address line is turned off, $T_1$ is turned off but the voltage at the gate of $T_2$ remains since the leakage current of $T_1$ is trivial in comparison. Hence, the current through the OLED remains unchanged after the turn off process. The OLED current changes only the next time around when a different voltage is written into the pixel.

Figure 6B:
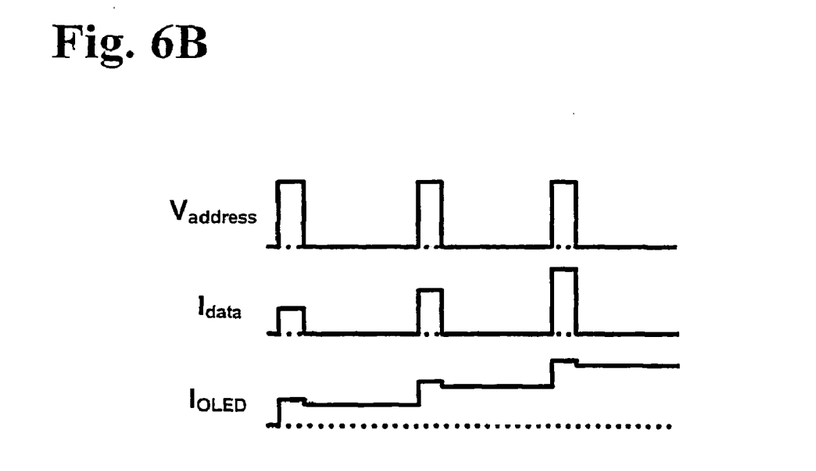

Unlike the previous driver, the data that is written into the 5-T pixel in this case is a current (see FIG. 6A). FIG. 6B shows input-output timing diagrams of a 5-T pixel driver. The address line voltage, $V_{address}$ and $I_{data}$ are activated or deactivated simultaneously. When $V_{address}$ is activated, it forces $T_1$ and $T_2$ to turn on. $T_1$ immediately starts conducting but $T_2$ does not since $T_3$ and $T_4$ are off. Therefore, the voltages at the drain and source of $T_2$ become equal. The current flow through $T_1$ starts charging the gate capacitor of transistors $T_3$ and $T_5$, very much like the 2-T driver. The current of these transistors start increasing and consequently $T_2$ starts to conduct current. Therefore, $T_1$'s share of $I_{data}$ reduces and $T_2$'s share of $I_{data}$ increases. This process continues until the gate capacitors of $T_3$ and $T_5$ charge (via $T_1$) to a voltage that forces the current of $T_3$ to be $I_{data}$. At this time, the current of $T_1$ is zero and the entire $I_{data}$ goes through $T_2$ and $T_3$. At the same time, $T_5$ drives a current through the OLED, which is ideally equal to $I_{data}*(W_5/W_3)$, which signifies a current gain. Now if $I_{data}$ and $V_{address}$ are deactivated, $T_2$ will turn off, but due to the presence of capacitances in $T_3$ and $T_5$, the current of these two devices cannot be changed easily, since the capacitances keep the bias voltages constant. This forces $T_4$ to conduct the same current as that of $T_3$, to enable the driver $T_5$ to drive the same current into the OLED even when the write period is over. Writing a new value into the pixel then changes the current driven into the OLED.

Figure 7:
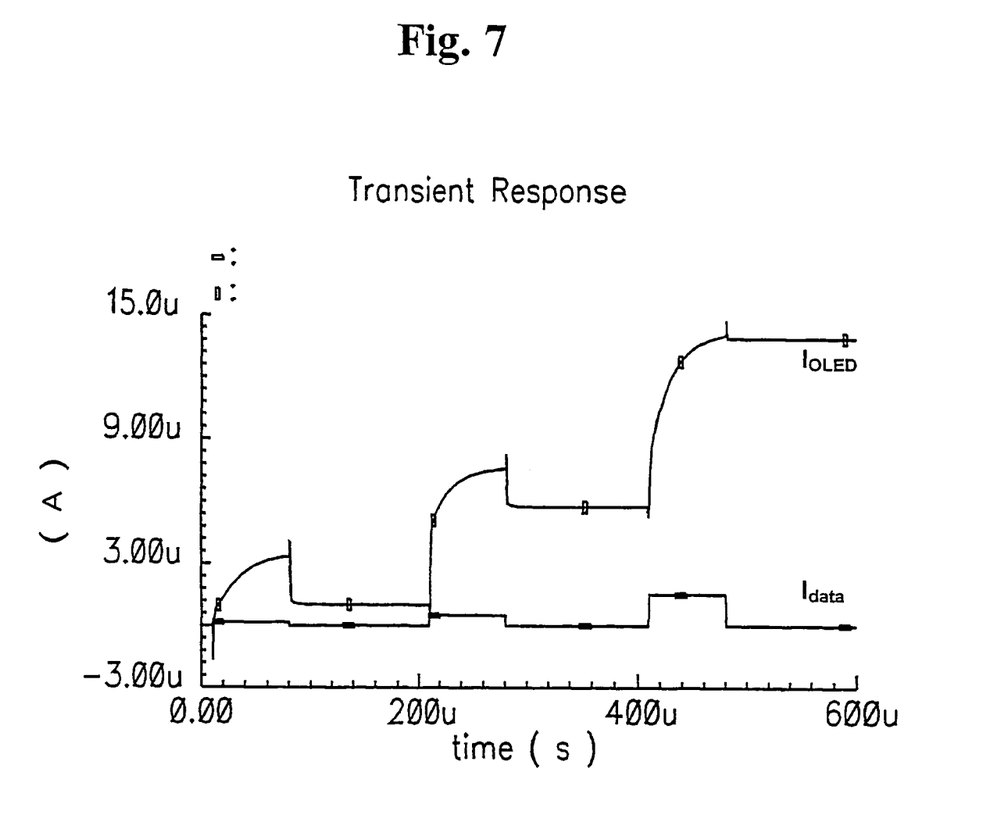
FIG. 7 shows transient performance of the 5-T driver for three consecutive write cycles.
Figure 8:
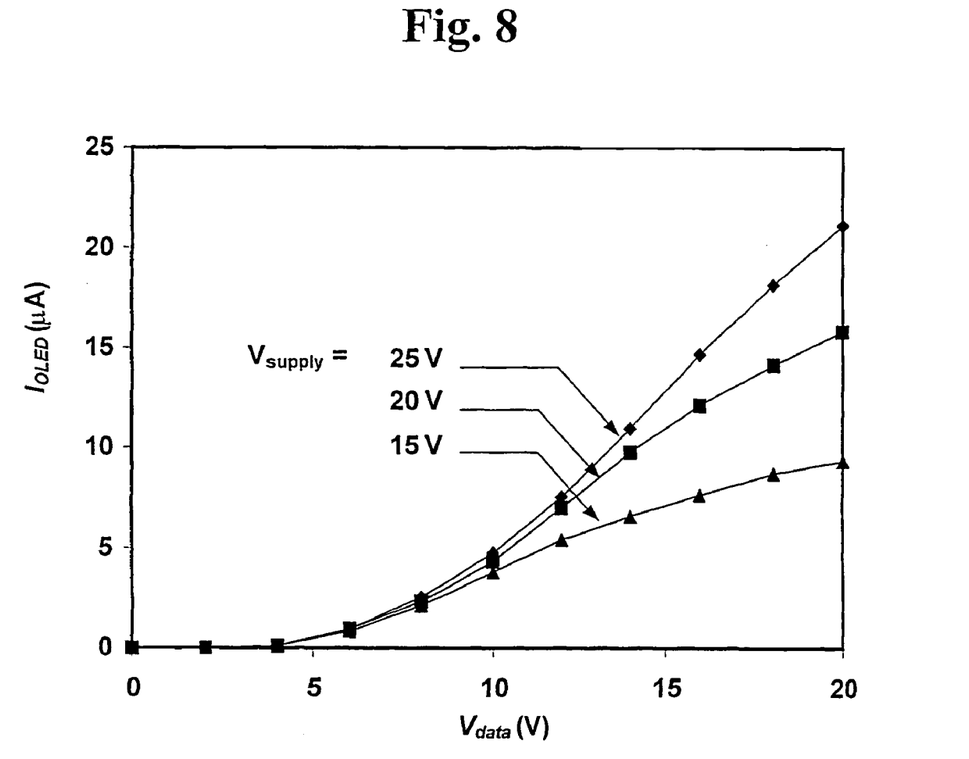
FIG. 8 shows input-output transfer characteristics for the 2-T pixel driver for different supply voltages.
Figure 9:
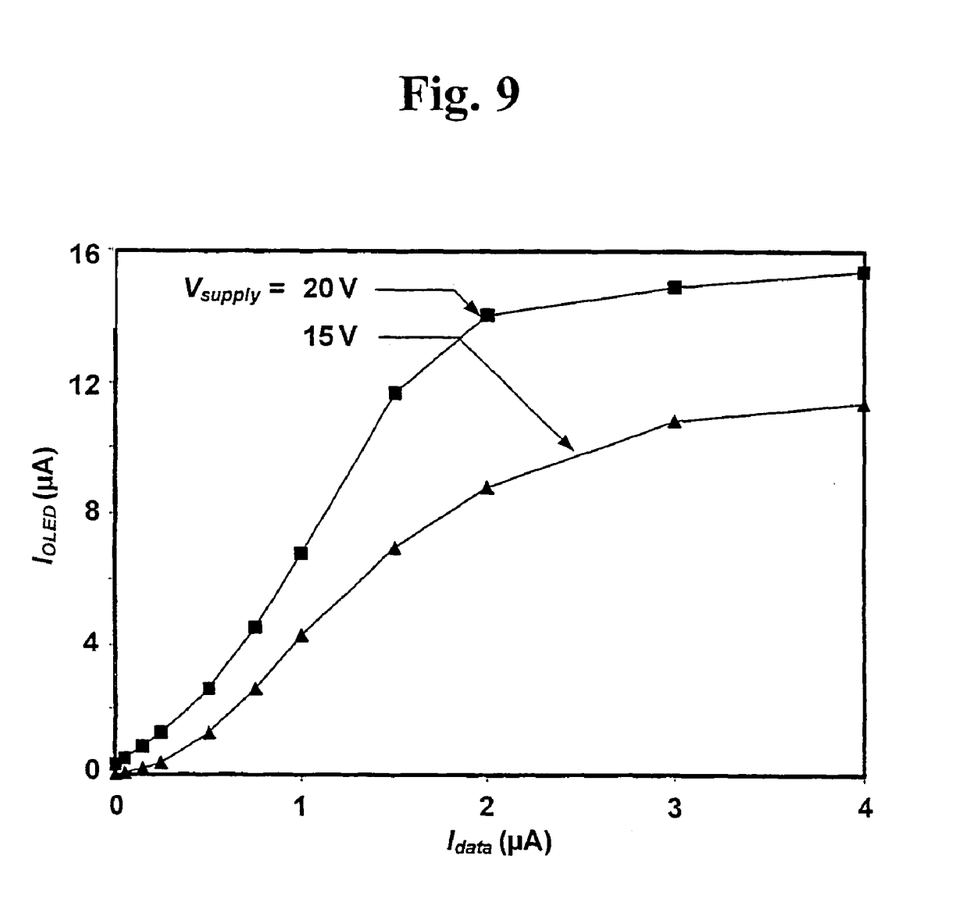
FIG. 9 shows input-output transfer characteristics for the 5-T pixel driver for different supply voltages.
Figure 10:
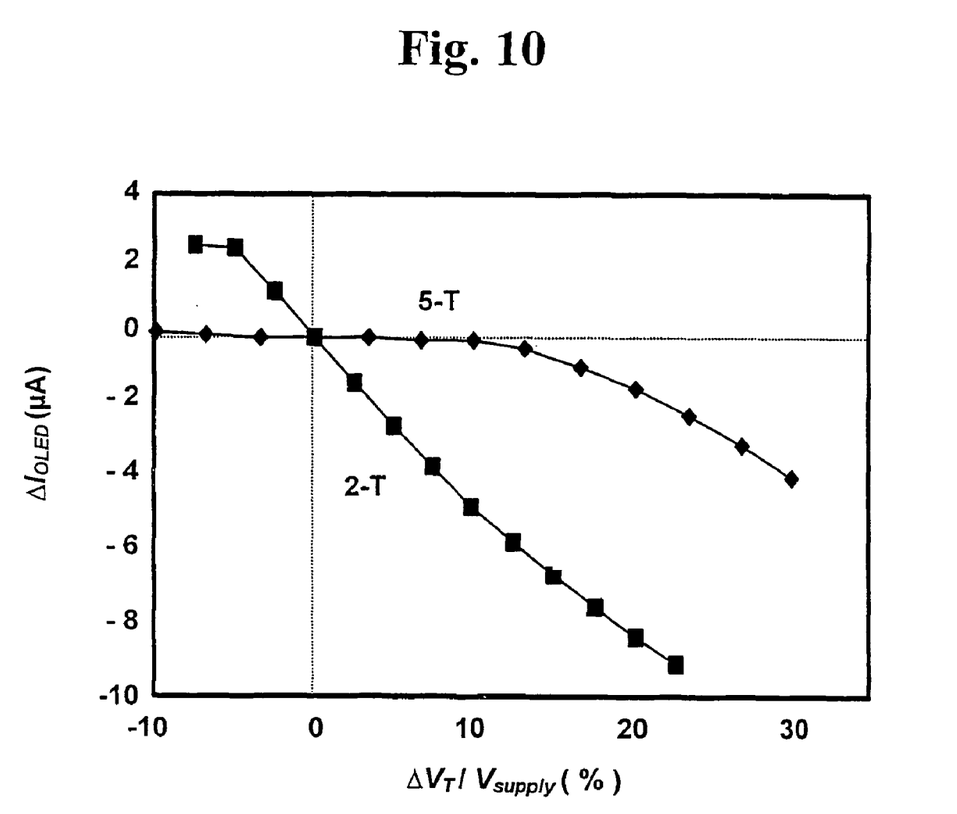
FIG. 10 shows variation in OLED current as a function of the normalized shift in threshold voltage.

The result of transient simulation for the 5-T driver circuit is shown in FIG. 7. As can be seen, the circuit has a write time of <70 µs, which is acceptable for most applications. The 5-T driver circuit does not increase the required pixel size significantly (see FIG. 1) since the sizes of T2, T3, and T4 are scaled down. This also provides an internal gain ($W_5/W_3=8$), which reduces the required input current to <2 µA for 10 µA OLED current. The transfer characteristics for the 2-T and 5-T driver circuits are illustrated in FIGS. 8 and 9, respectively, generated using reliable physically-based TFT models for both forward and reverse regimes. A much improved linearity (~30 dB) in the transfer characteristics ($I_{data}/I_{OLED}$) is observed for the 5-T driver circuit due to the geometrically-defined internal pixel gain as compared to similar designs. In addition, there are two components (OLED and $T_5$) in the high current path, which in turn decreases the required supply voltage and hence improves the dynamic range. According to FIG. 9, a good dynamic range (~40 dB) is observed for supply voltage of 20V and drive currents in the range $I_{OLED} \leq 10$ µA, which is realistic for high brightness. FIG. 10 illustrates variation in the OLED current with the shift in threshold voltage for the 2-T and 5-T driver circuits. The 5-T driver circuit-compensates for the shift in threshold voltage particularly when the shift is smaller than 10% of the supply voltage. This is because the 5-T driver circuit is current-programmed. In contrast, the OLED current in the 2-T circuit changes significantly with a shift in threshold voltage. The 5-T driver circuit described here operates at much lower supply voltages, has a much larger drive current, and occupies less area.

The pixel architectures are compatible to surface (top) emissive AMOLED displays that enables high on-pixel TFT integration density for uniformity in OLED drive current and high aperture ratio. A 5-T driver circuit has been described that provides on-pixel gain, high linearity (~30 dB), and high dynamic range (~40 dB) at low supply voltages (15-20V) compared to the similar designs (27V). The results described here illustrate the feasibility of using a-Si:H for 3-inch mobile monochrome display applications on both glass and plastic substrates. With the latter, although the mobility of the TFT is lower, the size of the drive transistor can be scaled up yet meeting the requirements on pixel area as depicted in FIG. 1.

Polysilicon has higher electron and hole mobilities than amorphous silicon. The hole mobilities are large enough to allow the fabrication of p-channel TFTs.

Figure 11:
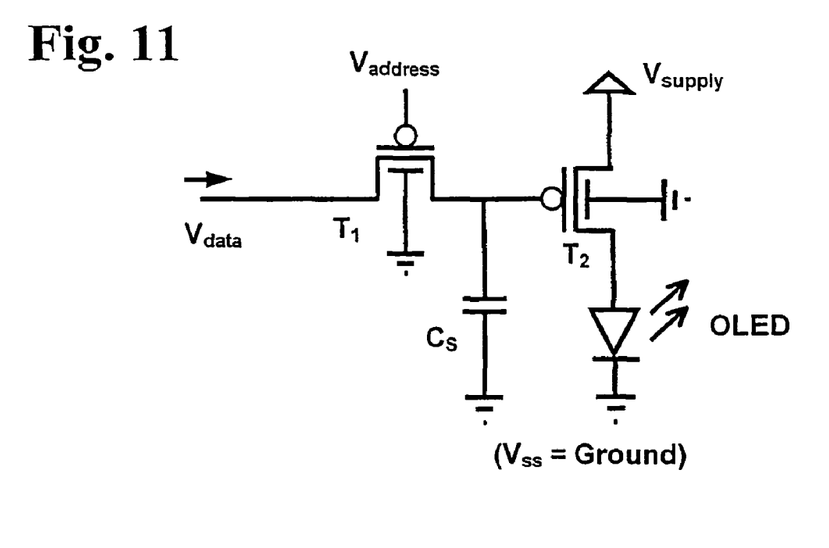
FIG. 11 shows a 2-T polysilicon based pixel current driver having p-channel drive TFTs.

The advantage of having p-channel TFTs is that bottom emissive OLEDs can be used along with a p-channel drive TFT to make a very good current source. One such circuit is shown in FIG. 11. In FIG. 11, the source of the p-type drive TFT is connected to Vdd. Therefore, Vgs, gate-to-source voltage, and hence the drive current of the p-type TFT is independent of OLED characteristics. In other words, the driver shown in FIG. 11 performs as a good current source. Hence, bottom emissive OLEDs are suitable for use with p-channel drive TFTs, and top emissive OLEDs are suitable for use with n-channel TFTs.

The trade-off with using polysilicon is that the process of making polysilicon TFTs requires much higher temperatures than that of amorphous silicon. This high temperature processing requirement greatly increases the cost, and is not amenable to plastic substrates. Moreover, polysilicon technology is not as mature and widely available as amorphous silicon. In contrast, amorphous silicon is a well-established technology currently used in liquid crystal displays (LCDs). It is due to these reasons that amorphous silicon combined with top emissive OLED based circuit designs is most promising for AMOLED displays.

Compared to polysilicon TFTs, amorphous silicon TFTs are n-type and thus are more suitable for top emission circuits as shown in FIG. 2. However, amorphous silicon TFTs have inherent stability problems due to the material structure. In amorphous silicon circuit design, the biggest hurdle is the increase in threshold voltage $V_{th}$ after prolonged gate bias. This shift is particularly evident in the drive TFT of an OLED display pixel. This drive TFT is always in the 'ON' state, in which there is a positive voltage at its gate. As a result, its $V_{th}$ increases and the drive current decreases based on the current-voltage equation below:

$$Ids=(\mu C_{OX}W/2L)(V_{gs}-V_{th})^2 \qquad \text{(in Saturation region)}$$

In the display, this would mean that the brightness of the OLED would decrease over time, which is unacceptable. Hence, the 2-T circuits shown earlier are not practical for OLED displays as they do not compensate for any increase in $V_{th}$.

The first current mirror based pixel driver circuit is presented, which automatically compensated for shifts in the $V_{th}$ of the drive TFT in a pixel. This circuit is the 5-T circuit shown in FIG. 6A.

Figure 12:
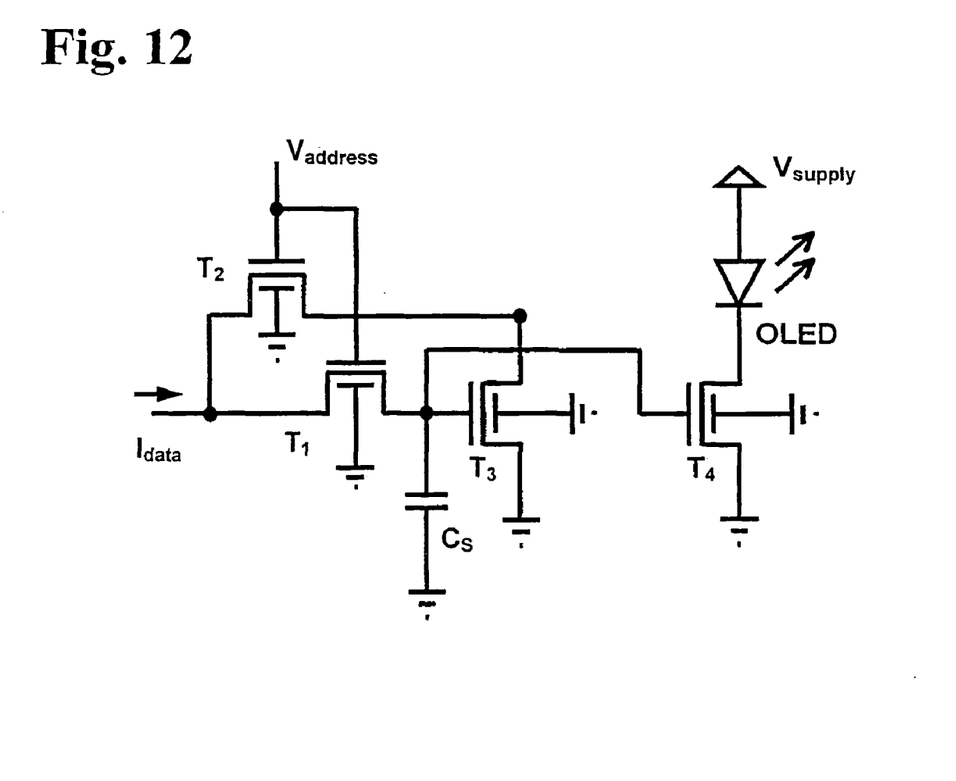
FIG. 12 shows a 4-T pixel current driver for OLED displays.

Four more OLED pixel driver circuits are presented for monochrome displays, and one circuit for full colour displays. All these circuits have mechanisms that automatically compensate for $V_{th}$ shift. The first circuit shown in FIG. 12 is a modification of the 5-T circuit of FIG. 6A. (Transistor $T_4$ has been removed from the 5-T circuit). This circuit occupies a smaller area than the 5-T circuit, and provides a higher dynamic range. The higher dynamic range allows for a larger signal swing at the input, which means that the OLED brightness can be adjusted over a larger range.

Figure 13:
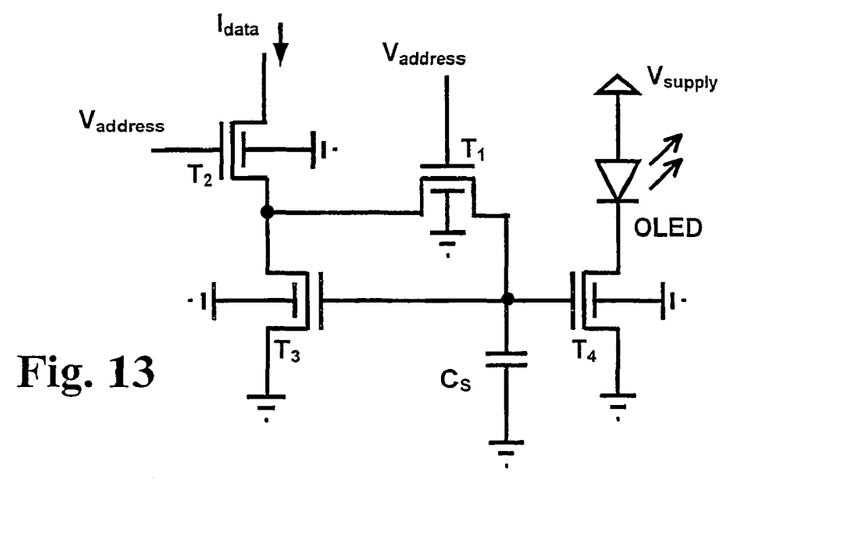
FIG. 13 shows a 4-T pixel current driver with a lower discharge time.

FIG. 12 shows a 4-T pixel driver circuit for OLED displays. The circuit shown in FIG. 13 is a 4-T pixel driver circuit based on a current mirror. The advantage of this circuit is that the discharge time of the capacitor Cs is substantially reduced. This is because the discharge path has two TFTs (as compared to three TFTs in the circuit of FIG. 12). The charging time remains the same. The other advantage is that there is an additional gain provided by this circuit because $T_3$ and $T_4$ do not have the same source voltages. However, this gain is non-linear and may not be desirable in some cases.

Figure 14:
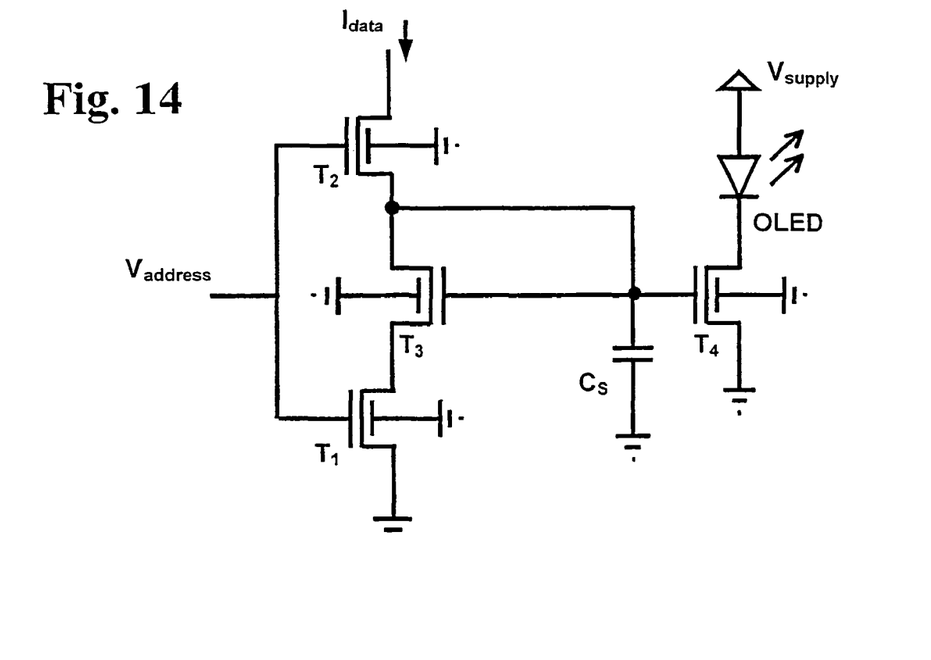
FIG. 14 shows a 4-T pixel current driver without non-linear gain.

In FIG. 14, another 4-T circuit is shown. This circuit does not have the non-linear gain present in the previous circuit (FIG. 13) since the source terminals of $T_3$ and $T_4$ are at the same voltage. It still maintains the lower capacitance discharge time, along with the other features of the circuit of FIG. 8.

Figure 15:
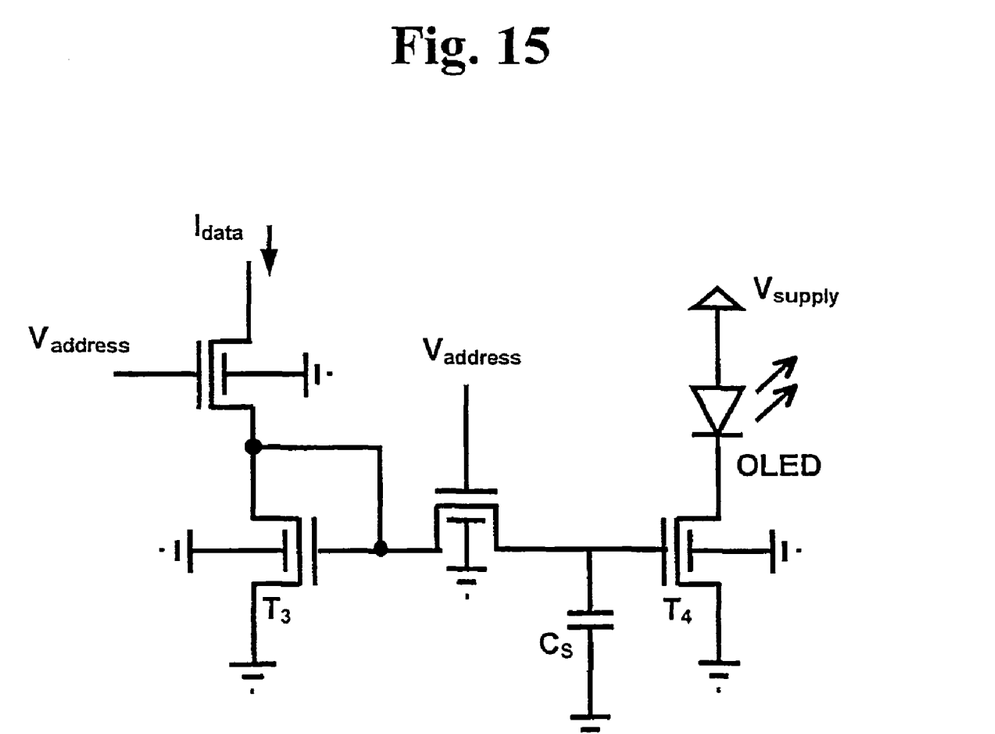
FIG. 15 shows a 4-T pixel current driver that is the building block for the full color circuit.

FIG. 15 shows another version of the 4-T circuit. This circuit is does not have good current mirror properties. However, this circuit forms the building block for the 3 colour RGB circuit shown in FIG. 16. It also has a low capacitance discharge time and high dynamic range.

Figure 16:
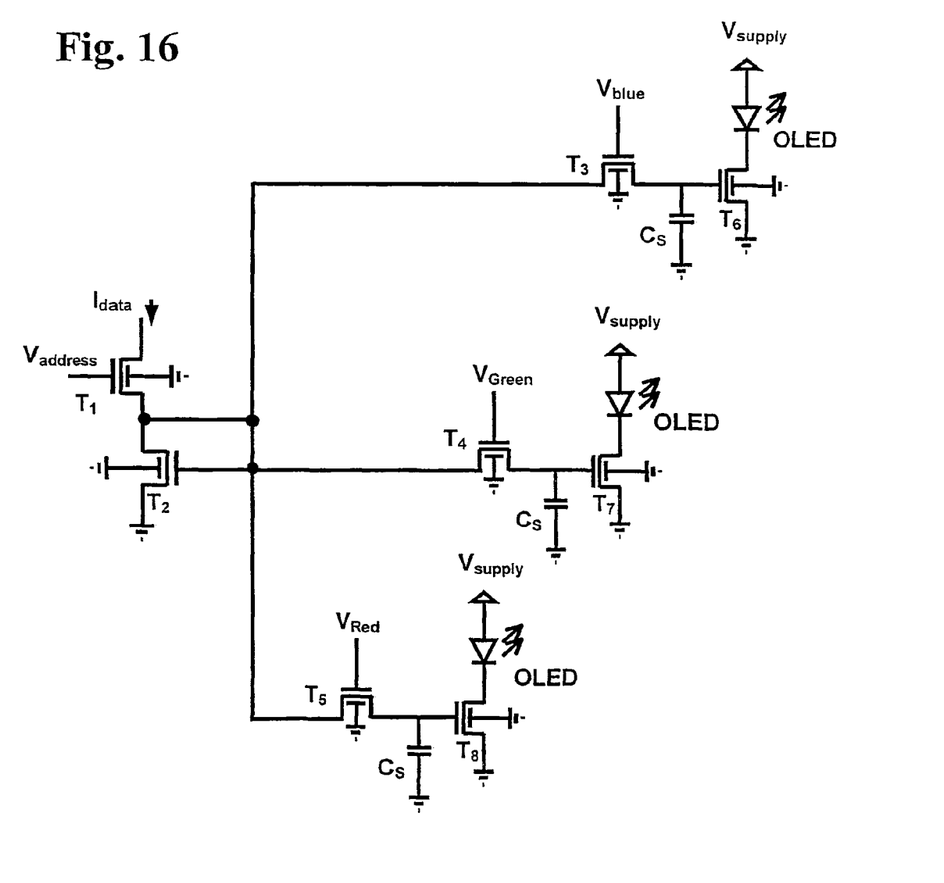
FIG. 16 shows a full color(RGB) pixel current driver for OLED displays.
Figure 17:
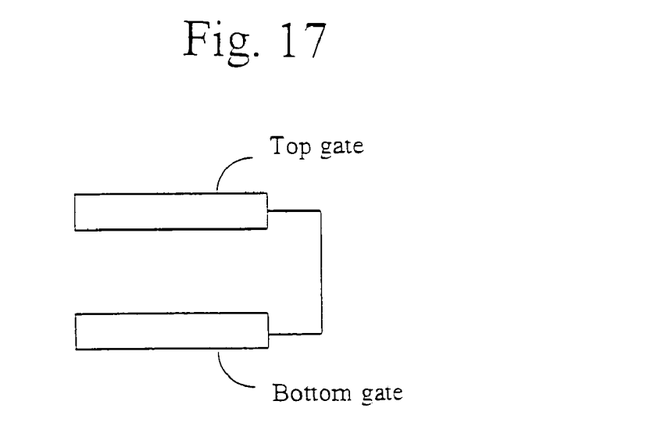
FIG. 17 shows a schematic diagram of the top gate and the bottom gate of a dual gate transistor where the top gate is electrically connected to the bottom gate.

The full colour circuit shown in FIG. 16 minimizes the area required by an RGB pixel on a display, while maintaining the desirable features like threshold voltage shift compensation, in-pixel current gain, low capacitance discharge time, and high dynamic range.

It is important to note that the dual-gate TFTs are used in the above-mentioned circuits to enable vertical integration of the OLED layers with minimum parasitic effects. But nevertheless the circuit compensates for the Vth shift even if the simple single-gate TFTs. In addition, these circuits use n-type amorphous silicon TFTs. However, the circuits are applicable to polysilicon technology using p-type or n-type TFTs. These circuits when made in polysilicon can compensate for the non-uniformity of the threshold voltage, which is a problem in this technology. The p-type circuits are conjugates of the above-mentioned circuits and are suitable for the bottom emissive pixels.

We claim:

1. A pixel current driver for an organic light emitting diode (OLED) having an OLED layer for emitting light, comprising:
    an address line;
    a data line; and
    a plurality of thin film transistors (TFTs) forming a current mirror, each having dual gates and driving for the OLED layer, the plurality of thin film transistors comprising:
    a switch thin film transistor, a first node of the switch transistor being connected to the data line and a first gate of the dual gates of the switch transistor being connected to the address line;
    a feedback thin film transistor, a first node of the feedback transistor being connected to the data line and a first gate of the dual gates of the feedback transistor being connected to the address line;
    a reference thin film transistor, a drain of the reference transistor being connected to a second node of the feedback transistor, a first gate of the dual gates of the reference transistor being connected to a second node of the switch transistor and a source of the reference transistor being connected to a ground potential; and
    a drive thin film transistor, a first gate of the dual gates of the drive transistor being connected to the gate of the reference transistor,
    a second gate of the dual gates of each thin film transistor being formed between a back electrode of the organic light emitting diode and the first gate of the respective thin film transistor.

2. The pixel current driver according to claim 1 wherein the thin film transistors are amorphous silicon.

3. The pixel current driver according to claim 1 wherein the thin film transistors are polycrystalline silicon.

4. The pixel current driver according to claim 3, wherein each of the transistors is a p-channel thin film transistor.

5. The pixel current driver according to claim 1, wherein the dual gates are fabricated in a normal inverted staggered TFT structure.

6. The pixel current driver according to claim 1, wherein the second gate of the thin film transistor is grounded.

7. The pixel current driver according to claim 1, wherein the second gate of the thin film transistor is electrically tied to the first gate of the thin film transistor.

* * * * *